United States Patent [19]

Pitts et al.

[11] Patent Number: 4,896,001

[45] Date of Patent: Jan. 23, 1990

[54] ANTI-ELECTRIC PROTECTION

[75] Inventors: Warren R. Pitts, Needham; Richard G. Miekka, Sudbury; Daniel J. White, Framingham, all of Mass.

[73] Assignee: Dennison Manufacturing Company, Framingham, Mass.

[21] Appl. No.: 822,496

[22] Filed: Jan. 27, 1986

[51] Int. Cl.$^4$ .......................... H05K 9/00; H04B 3/28; C23F 1/00

[52] U.S. Cl. .................. 174/35 MS; 307/91; 428/621

[58] Field of Search .................. 174/35 R, 35 MS, 36; 307/91; 428/621, 624–626

[56] References Cited

U.S. PATENT DOCUMENTS

| | | | |
|---|---|---|---|
| 2,858,451 | 10/1958 | Silversher | 174/35 MS |
| 3,231,663 | 1/1966 | Schwartz | 174/35 MS |
| 3,240,867 | 3/1966 | Maddox | 174/36 |
| 3,572,499 | 3/1971 | Mondano | 174/35 MS |
| 4,514,586 | 4/1985 | Waggoner | 174/35 R |
| 4,542,076 | 9/1985 | Bednarz et al. | 174/35 R |
| 4,556,757 | 12/1985 | Oberbach | 174/35 R |

OTHER PUBLICATIONS

Chomerics, Inc., Technical Bulletin #31, 8/69.
IBM, Technical Disclosure Bulletin, vol. 19, No. 10, 3/77.

Primary Examiner—Vit W. Miska
Attorney, Agent, or Firm—George E. Kersey

[57] ABSTRACT

A method and apparatus for protecting an object against adverse electric effects which comprises:
applying a continuous multiplicity of layers of a light weight protective continuous wrapper which is metallized on opposite sides and wider than the object, thereby to control the extent of the anti-electric protection.

9 Claims, 3 Drawing Sheets

ANTI-ELECTRIC PROTECTION

This invention relates to the protection of material and equipment from adverse electric effects, such as those caused by static electricity and electro-magnetic radiation.

There are two common electrical effects against which protection is required for sensitive materials. The first is known as "ESD" or "Electro-Sensitive Discharge". The second is "EMI" or "Electro-Magnetic Interference".

It is common practice in industry to seek protection against ESD or Electro-Sensitive Discharge effects by the use of antistatic materials which permit the controlled discharge of adverse static electricity. In order to deal with adverse EMI or Electro-Magnetic Interference, it is common practice to incorporate a controlled amount of conductive material into the object being protected or its housing.

These prior art techniques have the disadvantages of requiring relatively bulky and cumbersome materials. Another disadvantage is that antistatic materials are generally not antimagnetic and vice versa.

In the case of both ESD and EMI it is often desirable to omit conductive and/or antistatic particles from the material being protected. In all cases it is desirable to avoid the bulk and complexity of a rigid shield.

Although wrappers have been employed to give ESD and EMI protection, in the typical situation only one and not both protections have been achieved. For example, with semiconductive plastic foam, the result is ESD but not EMI protection.

Accordingly, it is an object of the invention to facilitate the protection of material and equipment from adverse electric effects.

Another object is to protect against both electrostatic and electromagnetic effects simultaneously.

A further object is to permit control over the extent of the anti-electric protection.

Still another object is to eliminate the need for bulk protective elements such as fixed, rigid shields.

SUMMARY OF THE INVENTION

In accomplishing the foregoing and related objects the invention provides a relatively flexible light-weight protective wrapper which is metallized on opposed sides.

Smoothness of the wrapper substrate, for example such as that provided by glassine is necessary to prevent pin-hole effects that would otherwise permit the undesired passage of charge and even penetration by undesired electro-magnetic fields.

In addition, the use of a thin-film material permits the user to wrap the material as many times as desired in order to attain a suitable level of electric imperviousness.

A further advantage of the invention is that the user need not be concerned with which side of the wrap is in contact with the item to be protected because the wrap is electrically symmetrical. In other words, either surface is functional when in contact with an electrically sensitive component. This structure lends itself to the Mobius strip and other convoluted configurations.

In order to facilitate grounding of the protective wrapper, the invention provides for a spiral in one of the metallic coatings. The spiral is detachable and extensible to an adjoining ground. This facilitates the grounding without any dislocation of the wrapper, since the spiral can be extended to any convenient grounding point.

In accordance with one aspect of the invention, objects to be protected can be wrapped in at least two different directions. The directions can be transverse to one another.

In accordance with another aspect of the invention, one of the metallic surfaces is coated, for example, by a polyolefin to permit the anti-electric wrapper to be sealed to other surfaces or to itself. The coating may also be a ionomer which has thermoplastic and thermosetting plastic and possesses polyolefin chains with ion cross-links of alkali or other metals. One of the metallized surfaces can include a perforated spiral which is extractable from the surface of metallization and can be extended to serve as a ground connection. The wrapper may also contain a pressure sensitive adhesive on one of the metallic surfaces and be accompanied by a release sheet to protect the pressure sensitive adhesive until the wrapper is ready to be used.

In accordance with a further aspect of the invention, an anti-electric wrapper can be formed by a metallic layer, substrate superimposed on the metallic layer, and a further metallic layer superimposed upon the substrate, opposite the first metallic layer. The metallic layers desirably are produced by vacuum metallization. The substrate can be paper, with glassine being particularly appropriate.

In a method of fabricating an anti-electric wrapper, one surface of a flexible support is vacuum metallized followed by vacuum metallizing the other surface of the support.

DESCRIPTION OF THE DRAWINGS

Other aspects of the invention will become apparent after considering several illustrative embodiments taken in conjunction with the drawings in which.

DETAILED DESCRIPTION

Figure 1A:
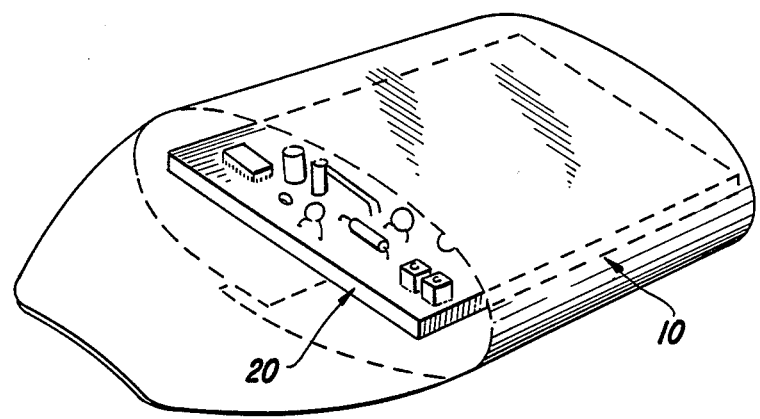
FIG. 1A is a prospective view showing the use of an anti-electric wrapper in accordance with the invention.
Figure 1B:
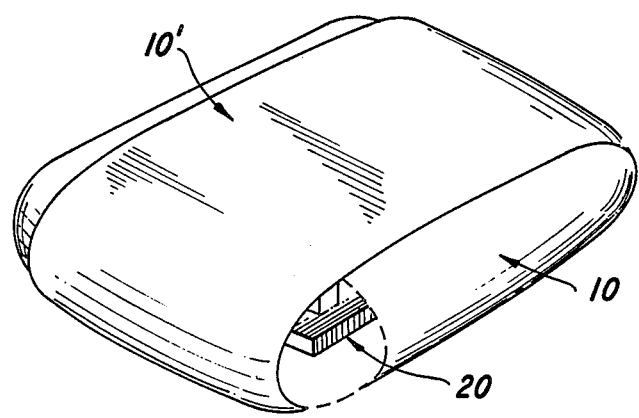
FIG. 1B is a prospective view of an alternative technique for employing the anti-electric wrapper of the invention.

With reference to the drawings an anti-electric wrapper 10 is illustrated in FIG. 1A as wrapped around a circuit board 20 containing a number of electrical components that are to be protected against both electrostatic and electromagnetic effects. The protective wrapper 10 shields the surface of the circuit board 20.

In order to enhance the protection afforded by the wrapper 10, a second wrapper 10' is wrapped about the circuit board with electrical components. The direction of wrap for the second component 10' is transverse or at a right angle to the direction of wrap for the wrapper 10. By using two different wrappings, which are mutually perpendicular, the interior circuit board 20 is securely protected against adverse electromagnetic and electrostatic effects.

Figure 2A:
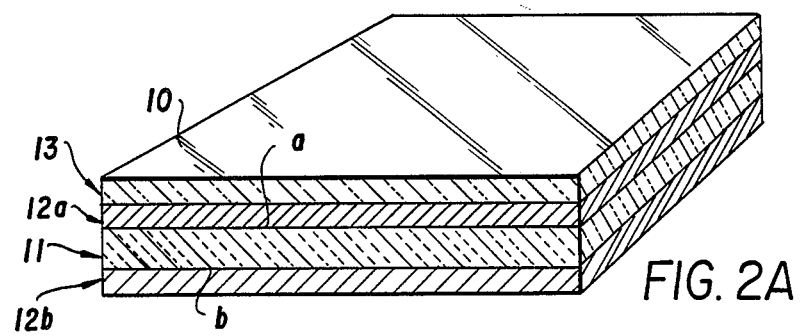
FIG. 2A is a prospective sectional view of an anti-electric wrapper in accordance with the invention.

A prospective cross-sectional view for an illustrative anti-electric wrapper 10 is set forth in FIG. 2A. The wrapper includes a substrate 11 which is desirably of glassine paper. The substrate 11 has opposed surfaces 11a and 11b which bear respective metallic layers 12a and 12b. Overlying one of the metallic layers, for example the layer 12a, is further layer 13.

The further layer 13 of FIG. 2A may be a polyethylene coating in order to permit the heat sealing of the wrapper 10 either to itself or to some other surface. Where the wrapper 10 is heat-sealed to itself, it is used to make, for example, receptacle or bags for the items or objects that are to be provided with anti-electric protection.

Alternatively or supplementally, the coating 13 may be an ionomer in which there are both thermoplastic and thermosetting constituents in the form of polyolefin chains with ion cross links of, for example, alkali metals. A suitable ionomer is available from the DuPont Company of Wilmington, Del. in the form of a polymer in which ethylene is a major component and their both ionic and covalent bonds. The polyethylene chains of DuPont product are ion cross-linked with sodium, potassium or other alkali metals. In this kind of material, both organic and inorganic compounds are linked together. Because the cross-linking is predominately ionic, the weaker bonds are easily broken when heated and may be processed as thermoplastic with a higher moisture vapor permeability than polyethylene. It will be understood that it is advantageous for the metallic layers 12a and 12b to be produced by vacuum metallization, particularly by vacuum metallized aluminum but other forms of metallic layers are also suitable.

Figure 2B:
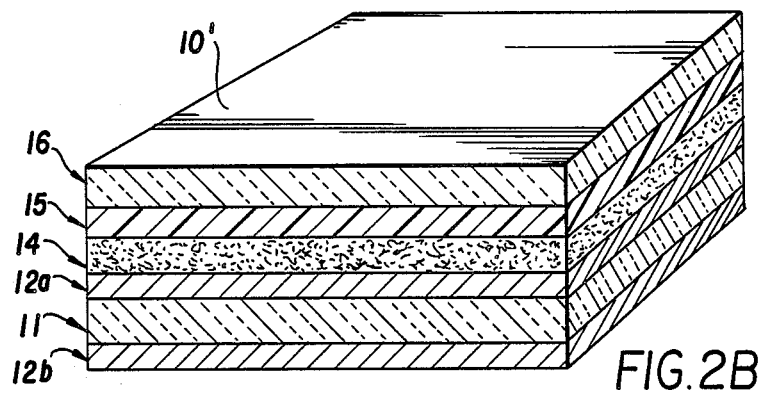
FIG. 2B is a prospective sectional view of an alternative anti-electric wrapper in accordance with the invention.

In the embodiment 10' of FIG. 2B the basic structure of FIG. 2A is repeated. Consequently, a substrate 11 has opposed surfaces with metallic coatings 12a and 12b. By contrast with FIG. 2A, however, the upper metallic layer 12a is coated with pressure sensitive adhesive 14, upon which is superimposed a release paper layer 15 and a possible further coating 16. In more applications where the pressure sensitive adhesive is employed, the coating 16 may be omitted and the release layer 15 is peeled away at the time that the wrapper 10' is to be used.

Figure 3:
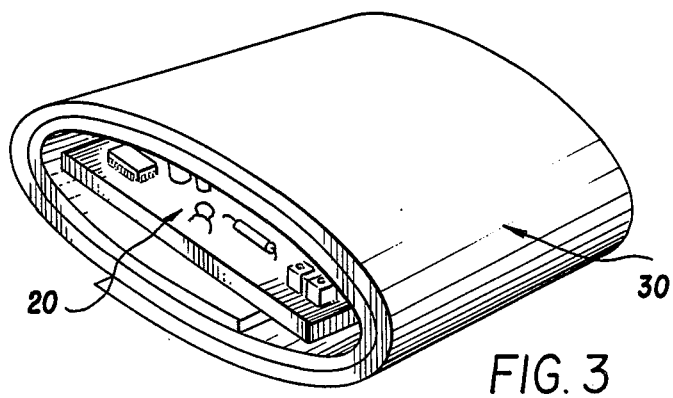
FIG. 3 is a prospective view illustrating a further use of an anti-electric wrapper in accordance with the invention.

FIG. 3 illustrates a further technique for applying the anti-electric wrapper of the invention. An elongated wrapper 30 is wrapped a number of times about the circuit board 20 that is to be protected. This permits control over the extent of the anti-electric protection. Where it is desired to increase the anti-electric protection even further, even more turns of wrapping are employed.

Figure 4A:
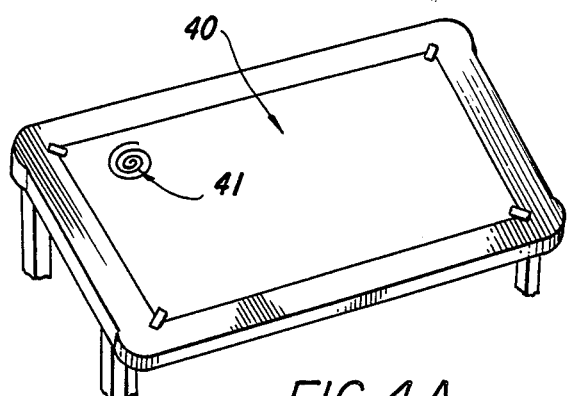
FIG. 4A is a partial prospective view showing a protective wrapper in accordance with the invention with a perforated spiral that functions as a ground wire.
Figure 4B:
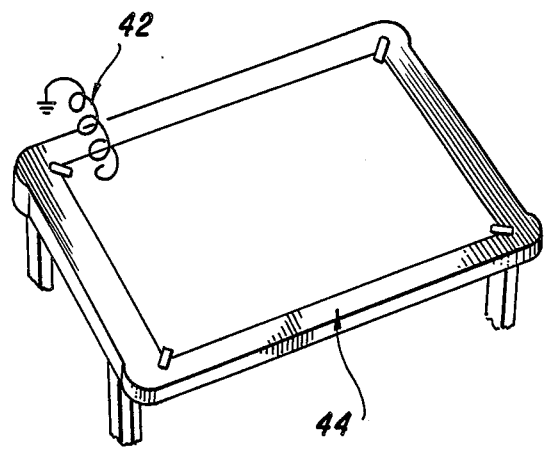
FIG. 4B is a further view similar to that of FIG. 4A illustrating the extension of the spiral to serve as a ground wire.

In FIG. 4A a further embodiment of the invention is illustrated in which a perforated spiral is included in the vacuum metallized surface. As shown in FIG. 4B, the spiral can be extended into a coil to serve as a grounded connection. Consequently, the wrapper of FIG. 4A can serve as a low-cost antistatic protective device and can even function as a table mat.

In a tested embodiment of the invention, the surface resistivity was 1.65 ohms per square for either surface. The alternation per layer of wrap was on the order of 30 to 40 db. This wrapper was used for the EMI and triboelectric protection of electronic chips, exposed to a corona discharge source of 15 Kilovolts without any perceptible degradation. A sensitive electrometer probe included within the wrapper registered no perceptible reading. This applied in the case of both continuous and pulsed discharge.

Other aspects of the invention will be apparent to those of ordinary skill in the art.

We claim:

1. The method of protecting an object against adverse electric effects which comprises:
    applying a continuous multiplicity of layers of a light weight protective continuous wrapper which is metallized on opposite sides and wider than said object, thereby to control the extent of the anti-electric protection.

2. The method of protecting an object against adverse electric effects which comprises:
    wrapping said object in at least two different directions with a light weight protective continuous wrapper which is metallized on opposite sides and wider than said object.

3. The method of claim 2 wherein the directions are transverse to one another.

4. The method of protecting an object against adverse electric effects which comprises:
    applying a light weight protective continuous wrapper which is metallized on opposite sides and wider than said object, said wrapper including a perforated spiral which is extractable from the surface of metallization and can be extended to serve as a ground connection.

5. The method of protecting an object against adverse electric effects which comprises:
    applying a light weight protective continuous wrapper which is metallized on opposite sides and wider than said object, said wrapper containing a pressure sensitive adhesive on one metallic surface and being accompanied by a release sheet to protect the pressure sensitive adhesive until the wrapper is ready to be used.

6. An anti-electric wrapper which comprises:
    (a) a substrate sheet wider than an item to be wrapped having opposed surfaces;
    (b) a metallic layer, superimposed on one surface of the substrate;
    (c) a further metallic layer superimposed upon the opposite surface of said substrate;
    (d) a pressure sensitive adhesive coating upon one of the metallic layers; and
    (e) a release sheet superimposed upon said pressure sensitive adhesive coating.

7. A wrapper as defined in claim 6 wherein the coating is an ionomer layer with both thermoplastic and thermosetting characteristics and polyolefin chains with ions cross-links of alkali metal.

8. A wrapper as defined in claim 6 wherein the coating is a polyolefin to permit the anti-electric wrapper to be sealed to other surfaces or to itself.

9. An anti-electric wrapper which comprises:
    (a) a substrate sheet wider than an item to the wrapped having opposed surfaces;
    (b) a metallic layer, superimposed on one surface of the substrate;
    (c) a further metallic layer superimposed upon the opposite surface of said substrate; and
    (d) a perforated spiral that is extendable from the surface of the metallized layer to provide a ground connection for the wrapper.

* * * * *